(12) United States Patent
Ichikawa et al.

(10) Patent No.: US 9,257,619 B2
(45) Date of Patent: Feb. 9, 2016

(54) LIGHT-EMITTING DEVICE AND MANUFACTURING METHOD THEREOF

(71) Applicant: NICHIA CORPORATION, Anan-shi (JP)

(72) Inventors: Masatsugu Ichikawa, Tokushima (JP); Takehito Shimatsu, Sendai (JP)

(73) Assignee: NICHIA CORPORATION, Anan-Shi (JP)

( * ) Notice: Subject to any disclaimer, the term of this patent is extended or adjusted under 35 U.S.C. 154(b) by 7 days.

(21) Appl. No.: 14/315,059

(22) Filed: Jun. 25, 2014

(65) Prior Publication Data

US 2015/0048398 A1 Feb. 19, 2015

(30) Foreign Application Priority Data

Jun. 26, 2013 (JP) ................................. 2013-134358
Jun. 23, 2014 (JP) ................................. 2014-128490

(51) Int. Cl.
*H01L 33/50* (2010.01)
*B23K 20/00* (2006.01)
*H01L 33/58* (2010.01)
*H01L 33/40* (2010.01)

(52) U.S. Cl.
CPC .............. *H01L 33/507* (2013.01); *B23K 20/00* (2013.01); *H01L 33/405* (2013.01); *H01L 33/50* (2013.01); *H01L 33/501* (2013.01); *H01L 33/502* (2013.01); *H01L 33/504* (2013.01); *H01L 33/58* (2013.01); *H01L 2933/0016* (2013.01); *H01L 2933/0041* (2013.01); *H01L 2933/0058* (2013.01)

(58) Field of Classification Search
CPC ......... H01L 33/20; H01L 33/44; H01L 33/50; H01L 33/501; H01L 33/502; H01L 33/504; H01L 33/505; H01L 33/507
USPC .......................................................... 257/98
See application file for complete search history.

(56) References Cited

U.S. PATENT DOCUMENTS 7,341,878 B2    3/2008  Krames et al.
8,163,651 B2 *  4/2012  Chen et al. .................... 438/694
(Continued)

FOREIGN PATENT DOCUMENTS

EP    2 216 835 A1    8/2010
EP    2 557 607 A1    2/2013
(Continued)

OTHER PUBLICATIONS

T. Shimatsu et al.,"Atomic diffusion bonding of wafers with thin nanocrystalline metal films," Journal of Vaccuum Science & Technology B, vol. 28, Issue 4, Jul./Aug. 2010, pp. 706-714.
(Continued)

*Primary Examiner* — Eduardo A Rodela
(74) *Attorney, Agent, or Firm* — Foley & Lardner LLP

(57) ABSTRACT

To provide a light-emitting device that is provided with an optical member firmly bonded to a semiconductor light-emitting element and has a high light extraction efficiency, the light-emitting device includes a light-emitting element having a semiconductor layer and an optical member bonded to the light-emitting surface of the light-emitting element with a metal film being interposed therebetween wherein the metal film has a thickness in a film-forming rate conversion not less than 0.05 nm nor more than 2 times of an atomic diameter of the metal atoms forming the metal film.

15 Claims, 6 Drawing Sheets

(56) References Cited

U.S. PATENT DOCUMENTS

| | | |
|---|---|---|
| 8,445,929 B2 | 5/2013 | Krames et al. |
| 8,748,923 B2 | 6/2014 | Krames et al. |
| 2006/0202105 A1 | 9/2006 | Krames et al. |
| 2008/0121919 A1 | 5/2008 | Krames et al. |
| 2010/0200886 A1 | 8/2010 | Krames et al. |
| 2011/0156056 A1 | 6/2011 | Krames et al. |
| 2013/0026527 A1* | 1/2013 | Ichikawa ................ 257/98 |
| 2013/0069104 A1* | 3/2013 | Ichikawa ................ 257/99 |
| 2014/0191264 A1* | 7/2014 | Kim et al. ............... 257/98 |

FOREIGN PATENT DOCUMENTS

| | | |
|---|---|---|
| JP | 2006-352085 A | 12/2006 |
| JP | 2010-046696 A | 3/2010 |
| JP | 2011-235300 A | 11/2011 |
| JP | 2012-223792 A | 11/2012 |
| WO | WO-2011/126000 A1 | 10/2011 |

OTHER PUBLICATIONS

The Extended European Search Report issued in European Application No. 14173810.4 dated Oct. 27, 2014.

* cited by examiner

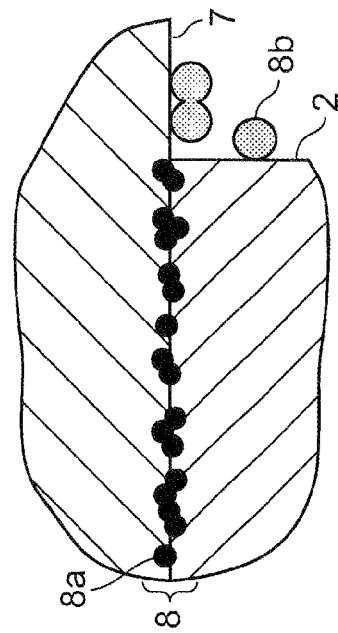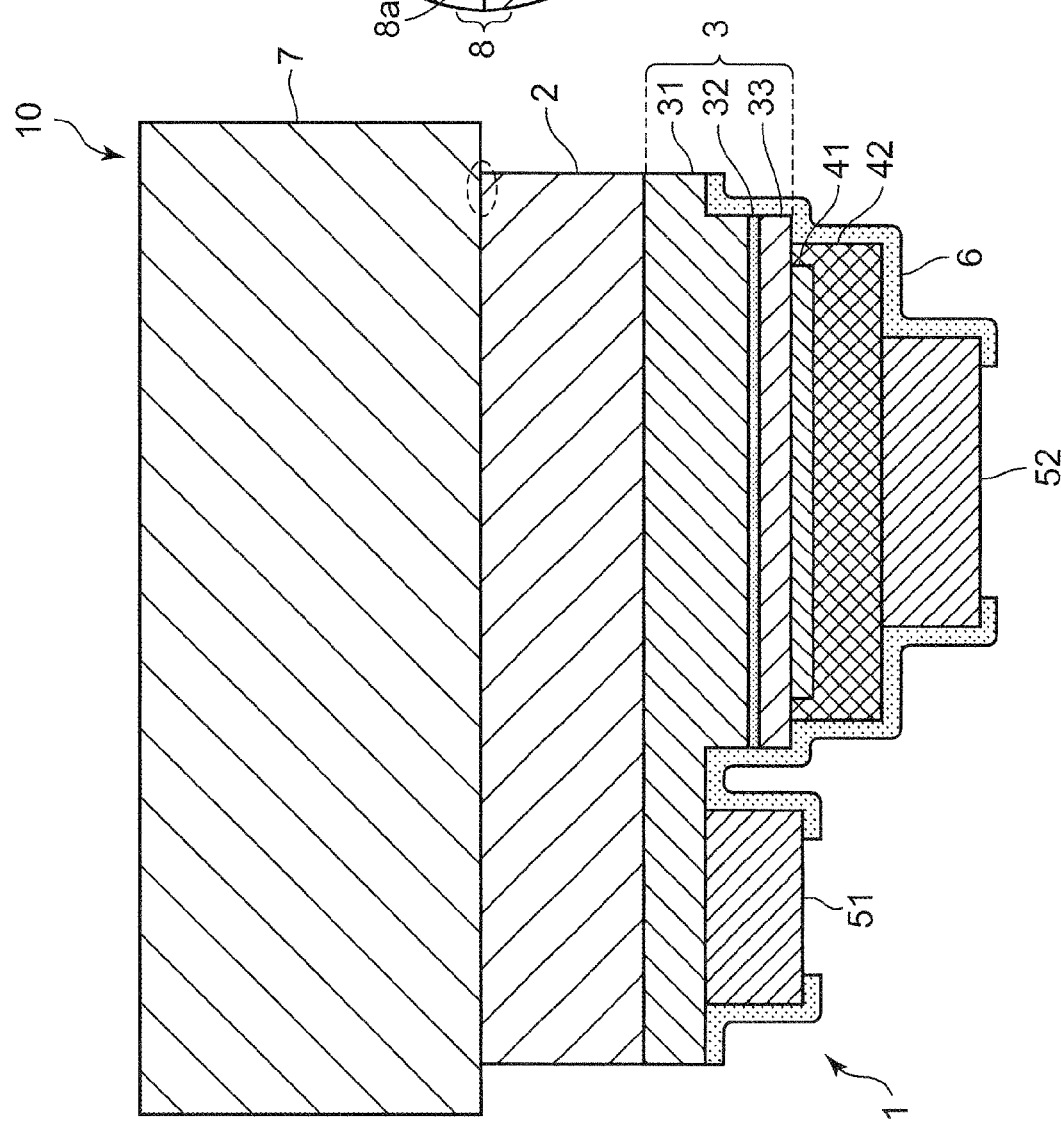

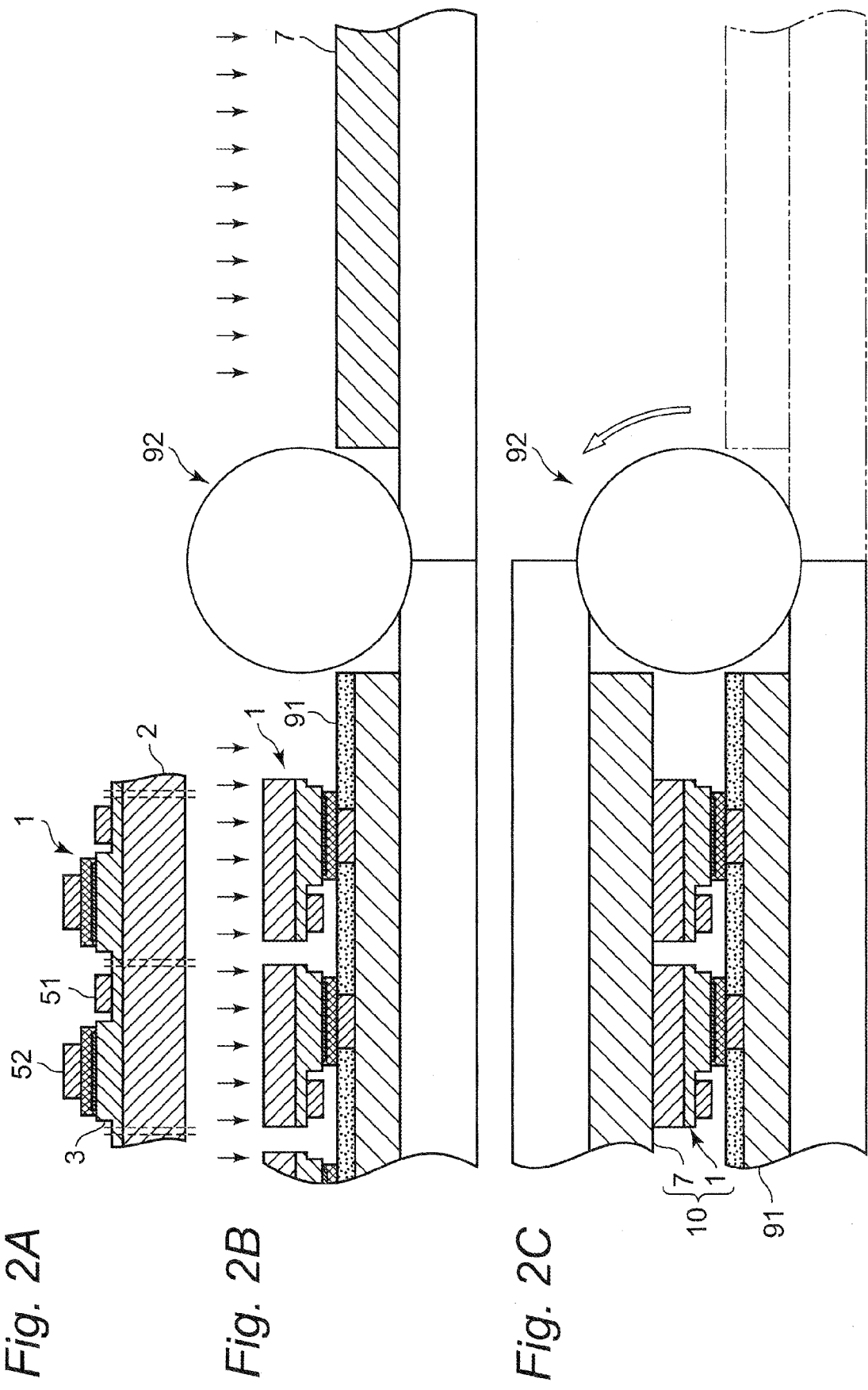

Fig. 5A ( 0.3 // 0.3 )
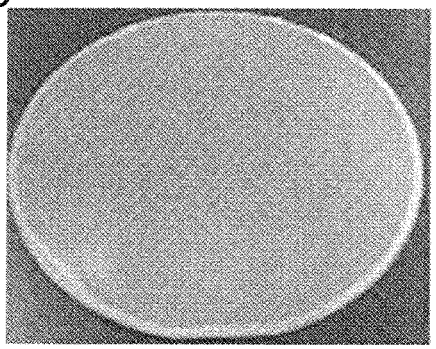
Fig. 5B ( 0.2 // 0.2 )
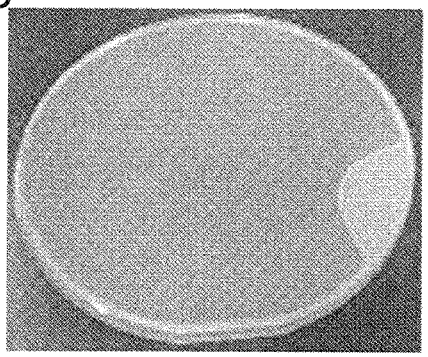
Fig. 5C ( 0.15 // 0.15 )
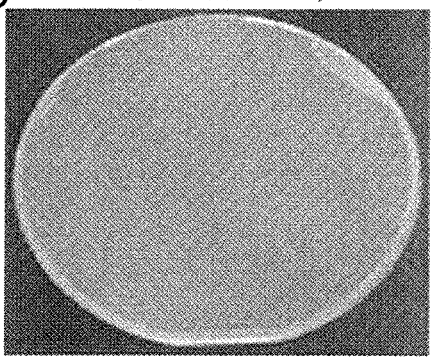
Fig. 5D ( 0.1 // 0.1 )
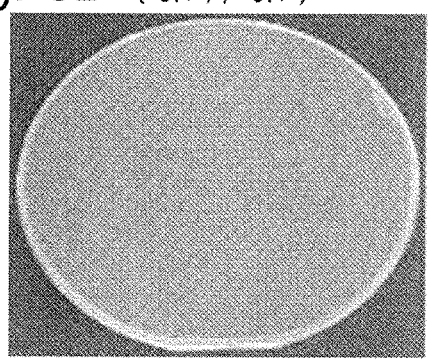
Fig. 5E ( 0.05 // 0.05 )
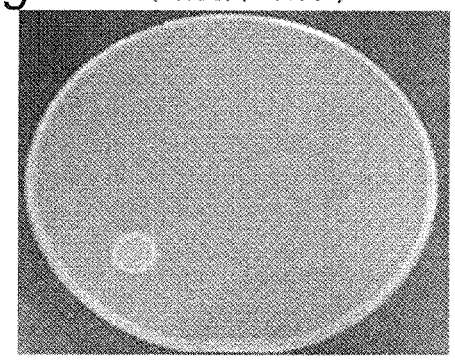
Fig. 5F ( 0.1 // 0 )
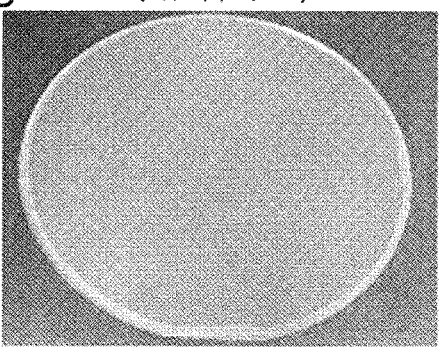
Fig. 5G ( 0.1 // 0, cleaning)
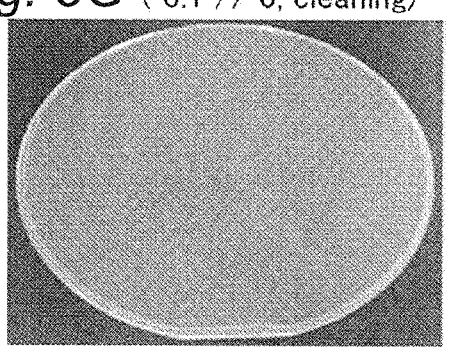

LIGHT-EMITTING DEVICE AND MANUFACTURING METHOD THEREOF

CROSS-REFERENCE TO RELATED APPLICATIONS

The present application claims priority under 35 U.S.C. §119 to Japanese Patent Application No. 2013-134358, filed on Jun. 26, 2013, and Japanese Patent Application No. 2014-128490, filed on Jun. 23, 2014. The contents of these applications are incorporated herein by reference in their entirety.

BACKGROUND OF THE INVENTION (1) Field of the Invention

The present invention relates to a light-emitting device on which semiconductor light-emitting elements are mounted and a manufacturing method of such a device.

(2) Description of Related Art

Conventionally, a light-emitting device on which semiconductor light-emitting elements, such as light-emitting diodes (LEDs) and laser diodes (LDs), are mounted is sometimes provided with an optical member, such as a wavelength conversion member and a lens, that is made in contact with the semiconductor light-emitting element, in order to extract light having desired optical characteristics, such as a wavelength and the like. In the light-emitting device of this type, a composite oxide or nitride, such as a YAG-based phosphor, or a translucent resin to which the phosphor is ground into powder and added, and is adopted as, for example, the wavelength conversion member.

In the semiconductor light-emitting element, in contrast to the fact that a nitride-based semiconductor forming the semiconductor light-emitting element and a substrate made of sapphire or the like for use in forming the nitride-based semiconductor are materials having a high refractive index, the translucent resin generally has a low refractive index and also has a high thermal expansion coefficient. For this reason, the light-emitting device, which is provided with an optical member made of the translucent resin of this type, tends to cause light released from the semiconductor light-emitting element to be easily reflected by the interface with the optical member, which lowers the light extraction efficiency. In addition, separation between the optical member and the semiconductor light-emitting element might occurs due to a difference between their thermal expansion coefficients. Moreover, since the resin has a low thermal conductivity, its heat radiating characteristic is inferior. In contrast, inorganic materials, such as ceramics, have thermal expansion coefficients close to those of the semiconductor light-emitting elements in comparison with the resin, so that selection can be properly made among materials having a high thermal conductivity or a high refractive index. However, in the light-emitting device, the optical member made of the inorganic material is normally installed as such a member preliminarily molded into a plate shape and bonded to the semiconductor light-emitting element, and for this reason, a layer of an adhesive agent made of a translucent resin is interpolated in a gap to the semiconductor light-emitting element.

Therefore, a method has been developed by which the optical member made of an organic material is bonded to the semiconductor light-emitting element without using an adhesive agent. For example, JP-A No. 2006-352085 has disclosed a light-emitting device in which a core generation layer is formed on the rear surface of a substrate prior to a formation of the semiconductor light-emitting element, with the core generation layer being thermally press-bonded to a ceramic material. However, in the bonding method described in JP-A No. 2006-352085, since the press-bonding process is carried out at a high temperature of about 200 to 500° C., the semiconductor light-emitting element tends to be deteriorated, or a press-bonding process at a low temperature fails to carry out a firm bonding process to sometimes cause separation.

Moreover, as a bonding method without requiring a high-temperature process, the inventors of the present application have developed a light-emitting device in which, by using a surface activation bonding process, a wavelength conversion member made of an inorganic material, such as YAG, is bonded to a sapphire substrate of a semiconductor light-emitting element (see International Publication No. 2011/126000).

On the other hand, in a semiconductor element (semiconductor device), a bonding method at a low temperature has been developed so as to bond a wafer on which the semiconductor elements have been formed to another wafer or the like. For example, in JP-A Nos. 2010-46696, 2011-235300 and 2012-223792 and T. Shimatsu, M. Uomoto, "Atomic diffusion bonding of wafers with thin nanocrystalline metal films", Journal of Vacuum Science & Technology B Volume 28, Issue 4, p. 706, 2010, a technique has been disclosed in which two members, such as wafers, are firmly bonded to each other at room temperature by using an atomic diffusion bonding process.

SUMMARY OF THE INVENTION

In the case of the surface activation bonding process described in International Publication No. 2011/126000, since it is difficult to bond an Si-based oxide such as $SiO_2$ or the like and since the bonding strength between sapphire members is not strong, the process is not suitable when a lens is formed by using, for example, glass or sapphire. In the case of the atomic diffusion bonding process described in JP-A Nos. 2010-46696, 2011-235300 and 2012-223792 and the like, by forming a metal film, such as Al or the like, on each of the bonding surfaces of two bonding members such as wafers or the like, in an inert gas atmosphere, and by superimposing the bonding surfaces on each other, the respective metal films are mutually bonded to each other firmly through the atomic diffusion of the metal. Therefore, in the case where this process is applied to a light emitting device, light emitted from the semiconductor light-emitting element is reflected from or absorbed into the metal film on the bonding surface to cause a reduction in the light extraction efficiency. Moreover, when the metal film is coated on the side face of the semiconductor light-emitting element, short circuits might occur.

In view of the above-mentioned problems, the present invention has been devised. An object of the present invention is to provide a light-emitting device that is provided with an optical member firmly bonded to a semiconductor light-emitting element (hereinafter, referred to as a light-emitting element) and has a high light extraction efficiency, and a manufacturing method for such a device.

As a result of researches on the atomic diffusion bonding process having comparatively less limitations of members to be bonded that are carried out by the inventors of the present application, it has been found the fact that even when the metal film is thinly formed in such a degree as not to intervene with the release of light, the optical member and the light-emitting element can be bonded to each other. That is, the light-emitting device in accordance with the present invention includes a light-emitting element having a semiconductor layer and an optical member. The optical member is bonded to the light-emitting surface of the light-emitting element with a metal film being interposed therebetween. The metal film has a thickness in a film-forming rate conversion not less than 0.05 nm nor more than 2 times of an atomic diameter of the metal atoms forming the metal film.

The manufacturing method of a light-emitting device in accordance with the present invention relates to a method for manufacturing a light-emitting device on which an optical member is bonded to the light-emitting surface of a light-emitting element having a semiconductor layer. The manufacturing method of a light-emitting device in accordance with the present invention includes a metal film forming process for forming a metal film on at least one of bonding surfaces of the optical member and the light-emitting element so as to have a thickness in a film-forming rate conversion not less than 0.05 nm nor more than an atomic diameter of the metal atoms forming the metal film, and a bonding process for bonding the mutual bonding surfaces with each other by making the bonding surfaces in contact with each other. The metal film forming process and the bonding process are continuously carried out in an inert gas atmosphere.

EFFECTS OF THE INVENTION

In accordance with the light-emitting device related to the present invention, by film-forming an extremely thin metal film on bonding surfaces in such a degree as hardly to reflect and absorb light emitted from the light-emitting element, it is possible to prepare an optical member that is firmly bonded thereto without lowering the light extraction efficiency. In accordance with the manufacturing method of the light-emitting device relating to the present invention, it is possible to easily manufacture the above-mentioned light-emitting device.

BRIEF DESCRIPTION OF THE DRAWINGS

FIGS. 1A and 1B are schematic views for use in explaining a structure of a light-emitting device in accordance with the present invention, and FIG. 1A is a cross-sectional view, and FIG. 1B, which shows a model for use in explaining a mechanism of a bonding process, is an enlarged view of a broken-line frame of FIG. 1A;

FIGS. 2A, 2B and 2C are schematic views for use in explaining a manufacturing method of a light-emitting device in accordance with the embodiment of the present invention, and FIG. 2A is a cross-sectional view showing a light-emitting element prior to a dividing process into individual pieces, FIG. 2B is a cross-sectional view showing a metal-film forming process, and FIG. 2C is a cross-sectional view showing a bonding process;

FIGS. 3A to 3C are single light observation images of embodiments of the present invention, and FIGS. 3D and 3E are ultrasonic-wave microscopic images of reference examples;

FIGS. 5A to 5G are visual photographs of samples that schematically simulate a light-emitting device of the present invention for use in indicating a bonded state between the light-emitting element and the optical member; FIG. 6A shows the curve with an incident angle of 0°, and FIG. 6B shows the curve with an incident angle of 50°.

DETAILED DESCRIPTION OF PREFERRED EMBODIMENTS

Figure 3A:
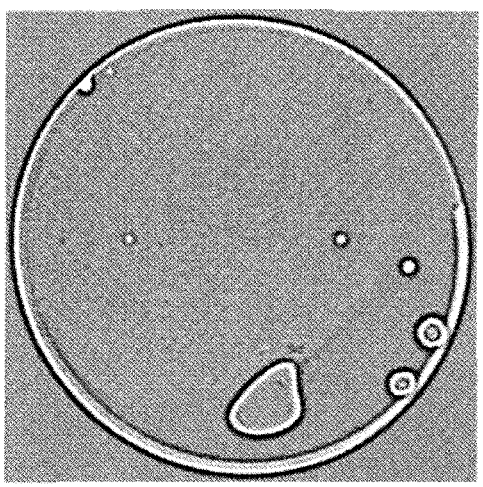
FIGS. 3A to 3C and FIGS. 3D and 3E represent sample images that schematically simulate a light-emitting device for use in indicating bonded states between the light-emitting element and the optical member.

A light-emitting device in accordance with the present invention includes a light-emitting element for use in flip-chip mounting (face-down mounting) in which a surface on the side opposite to a side with electrodes being formed thereon serves as a main light-emitting surface (hereinafter, referred to as a light-emitting surface), and an optical member such as a wavelength conversion member or the like that is bonded to a substrate surface (rear surface) serving as the light-emitting surface of the light-emitting element. The light-emitting device and the manufacturing method thereof in accordance with the embodiment of the present invention will be described with reference to the accompanying drawings.

[Light-Emitting Device]

As shown in FIG. 1A, a light-emitting device 10 in accordance with one embodiment of the present invention is provided with a light-emitting element 1 mounted so that a pair of electrodes 51 and 52 face downward, and a plate-shaped wavelength conversion member (optical member) 7 bonded to an upper surface of a substrate 2 of the light-emitting element 1. Light is mainly emitted upward. The light-emitting device 10 may be further provided with a wiring substrate (not shown) on which the light-emitting element 1 is mounted with the electrodes 51 and 52 being connected to. The electrodes 51 and 52 of the light-emitting element 1 may be electrically connected to the outside through bumps (not shown). Moreover, as shown in FIG. 1B, the light-emitting device 10 is provided with a metal film 8 that is formed at an interface between the light-emitting element 1 (substrate 2) and the wavelength conversion member 7, with metal atoms 8a being formed so as to be ranged along the interface. The elements forming the light-emitting device 10 will be described in detail.

(Light-Emitting Element)

The light-emitting element 1 is a semiconductor element (semiconductor light-emitting element) that allows to emit light by itself when a voltage is applied thereto, such as a light-emitting diode (LED). In the light-emitting device 10 shown in FIG. 1, the light-emitting element 1 is mounted with its face down, with the substrate 2 facing up; however, during its manufacturing process, the substrate 2 is located below (see FIG. 2A). When explained with FIG. 1A being upside down, the light-emitting element 1 has a structure in which a semiconductor structure 3 is formed on the translucent substrate 2, and the n-side pad electrode 51 serving as the n-side electrode, an entire surface electrode 41 serving as the p-side electrode, a cover electrode 42 and the p-side pad electrode 52 are respectively formed thereon, and a protective film 6 having opening portions that allow the pad electrodes 51 and 52 to be exposed is further formed on the upper surface thereof. In the light-emitting device 10 in accordance with the present invention, the shape of the light-emitting element 1 and the shapes, the positions and the number of the pad electrodes 51 and 52, when seen on the plan view, are not particularly limited.

The substrate 2 of the light-emitting element 1 may be made by a substrate material as long as the material allows light emitted by the semiconductor structure 3 (active layer 32) to transmit therethrough and also allows a nitride semiconductor to epitaxially grow as will be described later, and its size, thickness and the like are not particularly limited. As the substrate, an insulating substrate, such as sapphire with any one of C-plane, R-plane and A-plane as a main surface or spinel ($MgAl_2O_4$) with a (111) plane as a main surface, or an oxide substrate, such as lithium niobate, neodynium galliate or the like, that is lattice-bonded to silicon carbide (SiC), ZnS, ZnO, Si, GaAs, GaN, diamond, or a nitride semiconductor, may be used.

In the manufacturing step of the light-emitting element 1 during the growth of the nitride semiconductor, since a large number of light-emitting elements 1 are formed on a sheet of the substrate 2 (wafer), the substrate 2 needs to have a certain degree of strength as the base member with a sufficient thickness. On the other hand, after the semiconductor structure 3 and the pad electrodes 51 and 52 or the like that form the light-emitting element 1 have been formed thereon, the substrate 2 is preferably subjected to a grinding process (back grinding) or the like from the rear surface side to be thinner so as to be easily divided. At this time, the rear surface of the substrate 2 which is a bonding surface to the wavelength conversion member 7 is preferably smoothed so as to have an arithmetic average roughness Ra of 1 nm or less.

The semiconductor structure 3 of the light-emitting element 1 is formed by epitaxially growing an n-type semiconductor layer 31, an active layer 32 and a p-type semiconductor layer 33 successively. These layers are made of, but not limited to, a gallium nitride-based compound semiconductor, such as $In_XAl_YGa_{1-X-Y}N$ ($0 \leq X$, $0 \leq Y$, $X+Y<1$) or the like. Each of the n-type semiconductor layer 31, the active layer 32 and the p-type semiconductor layer 33 may have a single layer structure, or may also have a laminated layer structure having layers with different compositions and film thicknesses, a super lattice structure, or the like. In particular, the active layer 32, which serves as the light-emitting layer, is preferably prepared so as to have a single quantum well structure or a multiple quantum well structure in which thin films exerting a quantum effect are laminated, or more preferably prepared as a nitride semiconductor with its well layer containing In. Moreover, on the substrate 2, the n-type semiconductor layer 31 may be formed, with a base layer (not shown), such as a buffer layer or the like being desirably interposed therebetween. The buffer layer alleviates the mismatching of lattice constants between the substrate 2 and the n-type semiconductor layer 31.

Since electrodes to be respectively connected to the n-type semiconductor layer 31 and the p-type semiconductor layer 33 are formed on the upper side (lower side in FIG. 1) in the light-emitting element 1, the semiconductor structure 3 is designed to have a structure in which only the n-type semiconductor layer 31 is formed on one portion of an area, when seen in the plan view, without laminating any of the active layer 32 and the p-type semiconductor layer 33 thereon, so as to allow the n-side pad electrode 51 to be connected thereon. This semiconductor structure 3 is formed such that, after the n-type semiconductor layer 31, the active layer 32 and the p-type semiconductor layer 33 have been successively grown and laminated on the substrate 2, the p-type semiconductor layer 33 and the active layer 32 are removed by the use of photolithography and etching, so as to allow the n-type semiconductor layer 31 to be exposed in the area (n-side contact area) on which the n-side pad electrode 51 is formed. Moreover, on the peripheral edge portion of the semiconductor structure 3 also, when seen in the plan view, the p-type semiconductor layer 33 and the active layer 32 are preferably removed in the same manner as in the n-side contact area. Since the semiconductor structure 3 is formed in such a shape that, upon manufacturing the light-emitting element 1, in a state where the light-emitting elements are coupled to one after another in the in-plane directions (see FIG. 2A), grooves for use in easily carrying out individual dividing processes (scribing or dicing processes) are formed.

On the p-type semiconductor layer 33, the entire surface electrode 41, the cover electrode 42 and the p-side pad electrode 52 are successively laminated. The entire surface electrode 41 is an electrode for use in diffusing an electric current uniformly within the in-plane of the p-type semiconductor layer 33, and also serves as a reflection layer for use in reflecting light emitted by the active layer 32 toward the substrate 2 side serving as a light extraction surface in the light-emitting element 1 that is flip-chip packaged. The cover electrode 42 diffuses an electric current over the entire surface of the p-type semiconductor layer 33 in the same manner as in the entire surface electrode 41, and also covers the upper surface and the side faces of the entire surface electrode 41 so as to shield and prevent the entire surface electrode 41 from being made in contact with the p-side pad electrode 52 so that it functions as a barrier layer for preventing migration of materials for the entire surface electrode 41, in particular, Ag. Therefore, the entire surface electrode 41 is formed to cover as much area as possible, that is, over an area close to the entire surface, of the upper surface of the p-type semiconductor layer 33; however, it is designed so as to have a size slightly smaller than the cover electrode 42, when seen in the plan view, so that the cover electrode 42 is formed to coat the end face thereof. The n-side pad electrode 51 and the p-side pad electrode 52 serve as terminals for supplying an electric current from the outside of the light-emitting element 1. These electrodes may be formed by successively laminating respective materials to be described later, by using, for example, sputtering or vapor deposition.

The entire surface electrode 41 is preferably prepared as an ohmic electrode that is electrically connected to the p-type semiconductor layer 33 desirably, and is also designed to have a desired reflectance relative to the wavelength of light emitted at least by the active layer 32. Therefore, as the entire surface electrode 41, a single layer film made of a film composed of Ag or its alloy having a high reflectance of light, or a multilayer film made of Ni, Ti or the like, with the film of Ag or the like being placed as the lowermost layer, may be desirably used. More preferably, a multilayer film, such as an Ag/Ni/Ti/Pt film, an Ag/Ni/Ti/Ru film, an Ag/Ni/Ru film or the like, with an Ag film being formed as the lowermost layer (on the p-type semiconductor layer 33 side), may be used, and the film thicknesses of these multilayer films may be set to about 1000 nm, respectively.

The cover electrode 42 may be prepared as a single layer film of metal, such as, for example, Ti, Au, W, Al, Cu or the like, or an Al/Cu alloy, an Al/Cu/Si alloy or the like, which are alloys of these metals, or may be prepared as a multilayer film made of these metals or alloys. In particular, a multilayer film of Ti (lowermost layer)/Au/W/Ti, with Ti being formed as the lowermost layer (on the entire surface electrode 41 side), is desirably used.

Although the p-side pad electrode 52 is electrically connected to the p-type semiconductor layer 33 through the cover electrode 42 and the entire surface electrode 41, the n-side pad electrode 51 is directly connected to (made in contact with) the n-type semiconductor layer 31. In the same manner as in the general-use semiconductor elements, the pad electrodes 51 and 52 may be prepared by using a single layer or a multiple layer film made of metal electrode materials, such as metals of Au, Cu, Ni, Ti, Al, Pt, Cr, Rh or the like, or alloys of these. The pad electrodes 51 and 52 may be prepared as multilayer films in which, for example, a Cu single layer or a Cu/Ni laminated film is used as a lower layer, with an Au or AuSn alloy layer being used as an upper layer. Moreover, as the n-side pad electrode 51, Ti, Al, AlCuSi alloy, AlCu alloy or the like is preferably used as the lowermost layer, and more specifically, a multilayer film formed by stacking Ti/Au, Ti/Ni/Au, Al/Ti/Au, Al/Ti/Pt/Au, Ti/Pt/Au, AlCuSi/Ti/Pt/Au or the like from the bottom may be used, in order to obtain a desired electric contact with the n-type semiconductor layer 31.

The protective film 6 covers surfaces of the semiconductor structure 3 except for the exposed surfaces (upper surface and end surfaces) thereof and connection areas (opening portions) with the outside of the electrodes. In the light-emitting element 1 manufactured in the present embodiment, the protective film 6 is formed on the surface of the semiconductor structure 3 and the upper surface of the cover electrode 42, as well as on the peripheral edges of the pad electrodes 51 and 52. As the protective film 6, an oxide ($SiO_2$, $TiO_2$, $Ta_2O_5$, $Nb_2O_5$, $ZrO_2$, or MgO) of Si, Ti, Ta, Nb, Zr, Mg or the like, an Si nitride (for example, $Si_3N_4$), a nitride, such as AlN, or magnesium fluoride ($MgF_2$) or the like may be used. These materials may be formed as films by using a known method, such as sputtering, vapor deposition or the like. Additionally, in the light-emitting element 1, the protective film 6 may be formed prior to the formation of the pad electrodes 51 and 52 (as a lower layer) (not shown).

The light-emitting element to be mounted on the light-emitting device in accordance with the present invention is not particularly limited in its structure as long as it is packaged as a face-down structure for emitting light onto the substrate side of the light-emitting element. For example, the light-emitting element 1 may have a structure in which a pillar (pillar-shaped) electrode is connected onto the pad electrode 51 or 52 (lower side in FIG. 1) so as to align the height positions of the connection surfaces of the electrodes on the n-side and the p-side, or may be prepared with bumps or a layer of an eutectic alloy. Moreover, the light-emitting element 1 may be provided with a multilayer film of a dielectric material as a reflection layer in place of the entire surface electrode 41 on the p-type semiconductor layer 33. The light-emitting element of this type has a conductive oxide film serving as a transparent electrode material coated on substantially the entire surface of the p-type semiconductor layer, with a multilayer with a large number of pores formed therein being laminated thereon, and a p-side pad electrode is further formed thereon so as to be connected to the conductive oxide film through the pores of the multilayer film (not shown).

(Wavelength Conversion Member)

The wavelength conversion member 7 is formed by using an oxide, a nitride, an oxynitride or the like generally used as a phosphor, or an inorganic material such as glass or the like, formed by integrally sintering the material together with the above-mentioned phosphor, and a phosphor is preferably selected so as to obtain light with a desired color tone in combination with the light-emitting color of the light-emitting element 1. As the phosphor, more specifically, a YAG-based phosphor with which Y(yttrium), Al(aluminum) and Ga(garnet) are mixed and activated by Ce or the like, or a nitride-based phosphor, an oxynitride-based phosphor or the like, activated mainly by a lanthanoid-based element such as Eu, Ce or the like, may be used. Moreover, in the same manner as in the light-emitting element 1 (substrate 2), the bonding surface of the wavelength conversion member 7 is preferably smoothed so as to have an arithmetic average roughness Ra of 1 nm or less, prior to the bonding process with the light-emitting element 1.

As shown in FIG. 1A, in the light-emitting device 10 in accordance with the present embodiment, the wavelength conversion member 7 has a plate-shape with a size larger than the light-emitting element 1 by one size, when seen in the plan view; however, its shape is not particularly limited by this shape. The wavelength conversion member 7 may be molded so as to have, for example, a convex-lens shape with a spherical face on the upper surface (on the side opposite to the bonding surface). Alternatively, the light-emitting device 10 may have a structure in which, in place of the wavelength conversion member 7, an optical member, such as a lens or the like, formed by using an inorganic material such as $SiO_2$, sapphire, glass or the like, without having a phosphor, is bonded to the light-emitting element 1 (not shown).

(Metal Film)

The metal film 8 is formed at an interface between the light-emitting element 1 (substrate 2) and the wavelength conversion member 7 so as to join the two members with each other. Although the metal film 8 is referred to as "film", the metal film 8 may have a form that metal atoms 8a forming the metal film 8 are connected to one after another along the interface between the substrate 2 and the wavelength conversion member 7, as shown in FIG. 1B; thus, the structure is not necessarily formed into a continuous film shape although some portions of the metal atoms 8 are superposed with one another.

More specifically, the metal film 8 has an extremely thin thickness that is 2 times or less of the atomic diameter of the metal atoms in a film-forming rate conversion. That is, the metal film 8 is a film of two atomic layers or less even when formed so as to have an even thickness. Moreover, in the present embodiment, since the metal film is formed on a substrate made of a material different from a metal, such as, sapphire or glass, the film sometimes fails to form a film composed of one or two atomic layers with a uniform thickness. However, in the present embodiment, the metal film 8 may have a structure in which a plurality of minute crystals (metal portion) prior to their growth into a continuous film are located as dots in a separated state. That is, even in the case of a metal film having a substantially uniform film thickness composed of two atomic layers or less, or even in the case of a metal film composed of a plurality of minute metal portions located as dots in a separated state having a thickness limited by 2 times or less of the atomic diameter of the metal atoms in a film-forming rate conversion, its specific surface area is extremely large in comparison with a thick metal film of, for example, about 30 nm. As a result, a diffusion bonding process can be effectively carried out by utilizing a large surface diffusion (atomic diffusion) in comparison with a body-based diffusion. The thickness in a film-forming rate conversion refer to a thickness derived from a film-forming rate and a film forming time.

The metal film 8 is formed by allowing metal atoms 8a forming the metal films 8 adhered to the respective surfaces (bonding surfaces) of, for example, the substrate 2 and the wavelength conversion member 7 to be made in contact with each other so as to be firmly combined with each other through atomic diffusion. Moreover, the metal film 8 may be formed by a metal film adhered to one of the surfaces (bonding surfaces) of the substrate 2 and the wavelength conversion member 7. In this case, the metal film adhered to one of the surfaces (bonding surfaces) and the other surface of the substrate 2 or the wavelength conversion member 7 are combined with, for example, a surface activation bonding process. Even in the case of the surface activation bonding process, the metal film and the other substrate 2 or the wavelength conversion member 7 are more firmly bonded to each other in comparison with the bonded state between the substrate 2 and the wavelength conversion member 7. The metal film 8 is made of such a metal as to easily cause this atomic diffusion, and one kind or two or more kinds of alloys are selected for the film in accordance with the adhesion to the substrate 2 and the wavelength conversion member 7 as well as the transmittance (less absorption) of light emitted by the light-emitting element 1. More specifically, metals, such as Al, Au, Ag, Cu, Si, Ni, Pt, Ti, Ru, Ta and the like, are proposed. A metal or alloy adhered to the substrate 2 and a metal or alloy adhered to the wavelength conversion member 7 may be different from each other. In the light-emitting device 10 in accordance with the present invention, Al, Ti and Au are preferably used for the metal film 8. In particular, since Al and Ti are comparatively low in surface energy, these can easily allow the metal atoms 8a to be adhered to the bonding surfaces of the substrate 2 and the wavelength conversion member 7 uniformly within the in-plane areas. The metal film 8 is desirably formed by a film-forming process at a low temperature of 300° C. or less (for example, ordinary temperature) so as not to give damages to the light-emitting element 1 (semiconductor structure 3), by also using a sputtering process that ensures high adhesion to the film-forming objects (substrate 2 and wavelength conversion member 7).

In the light-emitting device 10, since the metal film 8 is formed between the substrate 2 having the light-emitting surface of the light-emitting element 1 and the wavelength conversion member 7, it needs to transmit light as much as possible, without absorbing the light, and its thickness is made as thin as possible, without depending on the combination of the wavelength of light and the kinds of metals. For example, in the case of an Al film, when its thickness exceeds 0.3 nm corresponding to the atomic diameter (diameter: 0.3 nm) of Al atoms, the absorption of light in a blue light region (wavelengths of 430 to 490 nm) comes to be observed, and in the case of a thickness of 0.6 nm, the light transmittance in the vicinity of a wavelength of 400 nm becomes about 98%. Based upon this fact, the metal film 8 is made to have a thickness of 2 times or less of the atomic diameter of the metal atoms 8a forming the metal film 8. However, in the present embodiment, in order to make the wavelength dependence of the transmittance smaller, the film thickness of the metal film 8 is desirably set to less than 2 times the atomic diameter, and more desirably set to not more than the atomic diameter. That is, the absorption or reflection by the metal film becomes greater as the wavelength becomes shorter to cause a reduction in the transmittance within a short wavelength range; however, when the film thickness of the metal film 8 is made less than 2 times the atomic diameter, the reduction in transmittance in the blue and ultraviolet regions can be made smaller, and when the film thickness of the metal film 8 is set to the atomic diameter or less, the reduction in transmittance in the blue and ultraviolet regions can be made further smaller, making it possible to substantially eliminate the wavelength dependence of the transmittance. The detailed explanation of the metal film 8 having such a thickness will be given in the manufacturing method thereof, and such a metal film 8 is formed by film-forming the metal for forming the metal film 8 on each of the bonding surfaces of the light-emitting element 1 (substrate 2) and the wavelength conversion member 7 with a thickness of less than the atomic diameter, and by integrally superposing the films with each other. In order to film-form the metal with such a thickness, the controlling process may be carried out based upon its film-forming rate, that is, the metal film 8 is made to have a thickness of 2 times or less of the atomic diameter of the metal atoms 8a for use in forming the corresponding metal film 8 in the film-forming rate conversion. In contrast, since it is difficult to film-form (adhere) the metal with a thickness of less than 0.05 nm in the film-forming rate conversion, the metal film 8 is set to have a thickness of 0.05 nm or more in the film-forming rate conversion, and is preferably set to have a thickness of 0.1 nm or more so as to more easily obtain the in-plane uniformity of the thickness (amount of adhesion).

Moreover, in the case where the metal film 8 contains Au, the following effects can be obtained.

Au absorbs relatively large amount of light having wavelengths of 550 nm or less among light rays in the range of green to yellow light ranges (wavelengths of 500 to 600 nm). Therefore, in the case where the wavelength conversion member 7 and the substrate 2 containing, for example, a YAG phosphor or the like having a peak in the green to yellow light range (wavelengths of 500 to 600 nm) are bonded to each other by using the metal film 8 containing Au, a part (return light) of light rays having wavelengths of 550 nm or less among light rays converted by the wavelength conversion member 7 is absorbed into the metal film 8. As a result, red components corresponding to the long wavelength range in the emitted light of the light-emitting device can be relatively increased so that its color rendering index can be enhanced.

Moreover, in the light-emitting device 10, the metal film 8 or a metal oxide 8b derived from the oxidized metal film 8 (metal atoms 8a) is also formed on the side faces of the light-emitting element 1 (see FIG. 1B) depending on its manufacturing method. This is because, when the metal atoms 8a forming the metal film 8 are film-formed on the bonding surface of the light-emitting element 1, that is, on the rear surface of the substrate 2, the metal atoms 8a are also adhered to the side faces of the light-emitting element 1 including the semiconductor structure 3 (not shown in Figs.). In the case where the metal film 8 is made of, for example, Au, since Au, in particular, has large surface energy, the metal atoms 8a are hardly adhered extensively, and formed into an island shape within the thickness of the above-mentioned range; therefore, since a film that continues from, for example, the n-type semiconductor layer 31 exposed to the side faces of the light-emitting element 1 to the p-side pad electrode 52 on the lower surface is not formed, no short circuits are caused between the two members.

In an attempt to form the metal film 8, with a thickness of, for example, about the atomic diameter in the film-forming rate conversion, the resulting film is formed into an island shape even by the use of a metal other than Au. Therefore, even when the metal film 8 is formed by the use of a metal other than Au, the short circuit preventive effect, for example, between the n-type semiconductor layer 31 and the p-side pad electrode 52 can be obtained when the film thickness of the metal film 8 is made thin.

Moreover, in the case where the metal film 8 is made of a metal that forms a natural oxide film in the air, such as, Al and Ti, since the side faces of the light-emitting element 1 are exposed to the air after the bonding process to the wavelength conversion member 7, all the metal atoms 8a adhered to the side faces so as to form the metal film 8 having a thickness of the above-mentioned range are quickly formed into the insulating metal oxide 8b. Therefore, in the light-emitting device 10, even if the metal film 8 is film-formed on the side faces of the light-emitting element 1 in a process (metal-film forming process in the manufacturing method to be described later) of its formation, no short circuits are caused in the light-emitting element 1. Moreover, in the case where the metal film 8 is made of Al or Ti, since their oxides (Al$_2$O$_3$, TiO$_2$) are transparent, the light emitted from the side faces of the light-emitting element 1 is hardly intervened.

(Bonding Process of Light-Emitting Element and Wavelength Conversion Member)

The mechanism of the bonding between the light-emitting element and the wavelength conversion member in the light-emitting device of the present invention will be described.

The atomic diffusion bonding is derived from a phenomenon in which, in a vacuum state or in an inert gas atmosphere, when two metal members or two metal films film-formed on the respective bonding surfaces of two bonding members to be bonded are mutually made in contact with each other, the respective metal atoms are mutually combined with each other so that a firm bonding is carried out. For this reason, normally, in the atomic diffusion bonding process, a metal film corresponding to at least one atomic layer per one side (one of the bonding surfaces of the bonding members to be bonded) is film-formed so as to allow metal atoms to adhere onto the entire portions of the two bonding surfaces. Moreover, the bonding surfaces of the bonding members to be bonded are not only smoothed so as to reduce voids as small as possible in number when the bonding members to be bonded are mutually superposed with each other on the bonding surfaces, but also preferably made to have a film thickness of several nm or more so as to allow the metal film to easily have such a film thickness as to have in-plane uniformity.

However, in the light-emitting device 10 of the present embodiment, the metal film 8 is film-formed with a thickness corresponding to less than one atomic layer on the respective bonding surfaces of the light-emitting element 1 (substrate 2) and the wavelength conversion member 7. Therefore, as described above, the metal film is formed in a state where minute crystals made of the metal are located as dots on the surface of the substrate 2 and the surface of the wavelength conversion member 7 so that the bonding surface of the substrate 2 and the bonding surface of the wavelength conversion member 7 are normally kept in a state where the surface of the substrate 2 and the surface of the wavelength conversion member 7 are partially exposed. In the present embodiment, the bonding surface partially exposed of the substrate 2 and the bonding surface partially exposed of the of the wavelength conversion member 7 are superposed with each other. In this case, not only the metal atoms 8a in contact with each other, but also the metal atoms 8a and the substrate 2 or the wavelength conversion member 7, or the substrate 2 and the wavelength conversion member 7 are made face to face with each other, and made in contact with each other. In this case, in a sputtering process for film-forming the metal film 8, when the metal film 8 (metal atoms 8a) is adhered, or during a cleaning process of the surface carried out prior to the adhering process, the surfaces of the substrate 2 and the wavelength conversion member 7 are activated by being exposed to ions and plasmas of a carrier gas, such as Ar or the like. Thus, the metal atoms 8a are mutually bonded to each other by an atomic diffusion bonding, while the exposed surfaces of the substrate 2 and the wavelength conversion member 7 are bonded to the metal atoms 8a or the exposed surfaces of the wavelength conversion member 7 and the substrate 2 in the same manner by a surface activation bonding. As a result, in the light-emitting device 10 in which the substrate 2 and the wavelength conversion member 7 are bonded to each other by the (thin) interpolated metal film 8 having an extremely small adhesion amount, the light-emitting element 1 and the wavelength conversion member 7 are firmly bonded to each other by the atomic diffusion bonding and the surface activation bonding.

Moreover, in the case where the light-emitting element 1 and the wavelength conversion member 7 are superposed on each other, if there is an area having an extremely wide gap relative to the atom size and metal atoms 8a between the substrate 2 and the wavelength conversion member 7 due to the concave/convex portions of the respective bonding surfaces, the corresponding area is not bonded and remains as a void (space) at the interface. When there is such an un-bonded area, the bonding strength between the light-emitting element 1 and the wavelength conversion member 7 is lowered, and light is reflected by the void to cause a reduction of the light extraction efficiency. Therefore, as described earlier, in order to reduce the gap at the time of the superposing process as small as possible, the light-emitting element 1 (substrate 2) and the wavelength conversion member 7 are preferably designed so that prior to the bonding process, more precisely, prior to the formation of the metal film, the respective bonding surfaces are desirably smoothed so as to have the arithmetic average roughness Ra of 1 nm or less.

[Manufacturing Method of Light-Emitting Device]

Referring to FIG. 2, the following description will discuss the manufacturing method of the light-emitting device in accordance with the embodiment of the present invention in a manner so as to include one example of the manufacturing process of a light-emitting element to be mounted thereon.

(Manufacturing Process of Light-Emitting Element)

On a substrate 2, respective nitride semiconductors to form a n-type semiconductor layer 31, an active layer 32 and a p-type semiconductor layer 33 are successively grown, and an annealing process is then carried out thereon, if necessary, so that the p-type semiconductor layer 33 is made to have a low resistivity.

Additionally, in the manufacturing method of the light-emitting element in accordance with the present invention, although the formation method of the semiconductor structure 3 is not particularly limited, known methods as the epitaxy method for a nitride semiconductor, such as MOVPE (Metal Organic Vapor Phase Epitaxy Method), MOCVD (Metal Organic Chemical Vapor Deposition Method), HVPE (Hydride Vapor Phase Epitaxy Method) and MBE (Molecular Beam Epitaxy Method) and the like, are preferably used. In particular, the MOCVD is preferably used because this method provides an epitaxial growth with superior crystallinity. Moreover, the respective layers 31, 32 and 33 of the semiconductor structure 3 are preferably grown by making a selection from various semiconductor epitaxy methods on demand and using the method depending on the purpose of use.

The p-type semiconductor layer 33 and the active layer 32 are etched so as to expose the n-type semiconductor layer 31 at one portion of the surface (upper surface) as a contact area for use in connecting the n-side pad electrode 51. In the same manner, an area (scribe area) forming a peripheral edge of the light-emitting element 1 (chip) is also etched to the same depth as that of the above-mentioned n-side contact area so that grooves in a lattice pattern when seen in the plan view are formed.

The entire surface electrode 41 is formed on the p-type semiconductor layer 33 by using a sputtering method and a lift-off method or the like. Moreover, on the p-type semiconductor layer 33, the cover electrode 42 is formed in the same manner, with a size slightly larger than the entire surface electrode 41, when seen in the plan view. Next, the n-side pad electrode 51 and the p-side pad electrode 52 are formed at respective predetermined areas on the exposed n-type semiconductor layer 31 and the cover electrode 42.

An insulating film is formed on the entire surface (upper surface), and the insulating film on the pad electrodes 51 and 52 is removed by etching to form the protective film with the pad electrodes 51 and 52 being exposed; thus, a wafer in which the light-emitting elements 1 are coupled to one after another in the surface direction is completed (see FIG. 2A). Additionally, in the light-emitting element 1 shown in FIG. 2, the protective film 6 is omitted.

(Bonding Surface Smoothing Process)

The substrate 2 on the wafer rear surface is grinded (rear surface grinding, back grinding) to have a thin thickness capable of being divided by dicing or the like, and further polished and smoothed so as to have an arithmetic average roughness Ra of 1 nm or less. The wafer thus thinned is divided along scribe areas indicated by broken lines shown in FIG. 2A to complete a single light-emitting element 1 (chip). Moreover, the wavelength conversion member 7 is molded into a desired plate thickness, and the bonding surface to the light-emitting element 1 is smoothed so as to have an arithmetic average roughness Ra of 1 nm or less.

(Metal Film Forming Process)

With keeping the side on which the pad electrodes 51 and 52 are formed down, the light-emitting elements 1 are arranged on an adhesive sheet 91 with predetermined intervals, and fixed thereto (see FIG. 2B). As shown in FIG. 2B, on each of mounting portions of a fixture 92 on which two plates (mounting portions) are horizontally placed side by side and connected with a hinge, the light-emitting element 1 fixed onto the adhesive sheet 91 and the wavelength conversion member 7 are mounted and fixed with their bonding surfaces facing up. Then, the light-emitting element 1 and the wavelength conversion member 7 are transported into a load lock chamber of a sputter device together with the fixture 92 on which the light-emitting element 1 and the wavelength conversion member 7 are mounted. Additionally, as the adhesive sheet 91, those sheets for use in protecting the semiconductor element (wafers and chips) from back grinding, dicing or the like in the manufacturing process of the semiconductor element (semiconductor device) may be adopted. Moreover, the sputter device is provided with a robot arm for use in rotating one of the mounting portions of the fixture 92 by 180° around the hinge in the load lock chamber, in addition to general devices, such as a processing chamber (chamber), a stage (mounting base), a power supply, the load lock chamber, an exhausting system, a transporting system, a FAB (Fast Atom Beam) gun and the like.

The load lock chamber of the sputter device is exhausted, and an inert gas is introduced thereto so that its pressure is adjusted in accordance with the atmosphere of the processing chamber of the sputter device. Then, the light-emitting element 1 and the wavelength conversion member 7 are transported into the processing chamber together with the fixture 92, and the pressure is further adjusted, if necessary. The inert gas is a carrier gas (introducing gas) for use in sputtering, and those gases that are inactive to the metal film 8 may be adopted. More specifically, rare gases, such as Ar, Ne, Kr, Xe or the like, and $N_2$ or the like, may be used.

By carrying out sputtering, with a predetermined voltage being applied to a metal target of the material of the metal film 8, a metal film is formed on the substrate 2 and the wavelength conversion member 7. This metal film is formed on the surfaces of the substrate 2 and the wavelength conversion member 7 respectively with a thickness from 0.05 nm or more to the atomic diameter of the corresponding metal atoms or less in the film-forming rate conversion, more preferably, with a thickness of less than the atomic diameter of the corresponding metal atoms. At this time, these surfaces are activated by being exposed to Ar ions. Moreover, by preliminarily calculating the film-forming rate in the sputtering, a controlling is carried out to provide a desired film thickness (amount of adhesion of metal) based upon the film-forming time (applied time of voltage).

(Bonding Process)

After the completion of the sputtering, the light-emitting element 1 and the wavelength conversion member 7 are transported from the processing chamber together with the fixture 92, and carried into the load lock chamber. Then, with the inert gas atmosphere being maintained, one of the mounting portions of the fixture 92, that is, in this case, the mounting portion on which the wavelength conversion member 7 is fixed is rotated longitudinally so as to superpose the wavelength conversion member 7 onto the light-emitting element 1 (see FIG. 2C). Thus, the substrate 2 of the light-emitting element 1 and the wavelength conversion member 7 are bonded to each other so that a structure in which a plurality of light-emitting devices 10 are coupled to one after another by one sheet of the wavelength conversion member 7 is completed. Additionally, upon bonding the light-emitting element 1 and the wavelength conversion member 7 to each other, no load is particularly required, and all the mutual bonding surfaces, that is, the entire upper surfaces of the light-emitting elements 1 (substrate 2), can be made tightly in contact with the wavelength conversion member 7. Then, the load lock chamber is released to the atmospheric pressure, and the light-emitting device 10 is transported from the load lock chamber together with the fixture 92. By exposing the light-emitting device 10 to the atmosphere, the metal film (metal atoms 8*a*) adhered to the side faces or the like of the light-emitting element 1 is oxidized to form the metal oxide 8*b* (see FIG. 1B).

Lastly, the wavelength conversion member 7 is cut so that the light-emitting devices 10 are divided into one device by one device. Moreover, if necessary, the upper surface of the wavelength conversion member 7 may be processed into a spherical surface. Additionally, in FIG. 2, after having been bonded to a plurality of arranged light-emitting elements 1, one sheet of the wavelength conversion member 7 is cut; however, in the same manner as in the light-emitting element 1, the wavelength conversion member 7 formed on each of the light-emitting devices 10 may be arranged on an adhesive sheet and fixed thereon, and mounted on the fixture 92 so as to be subjected to the bonding process. Alternatively, in the case where the light-emitting element (wafer) can be cut along the scribe areas, that is, in the case where the plate thickness of the wavelength conversion member 7 is thin or the like, the light-emitting element 1 prior to the individual dividing process, that is, the wafer, may be bonded to the wavelength conversion member 7, and may be then cut together with the wavelength conversion member 7 to be divided into individual pieces. Alternatively, the wavelength conversion member 7 corresponding to each of the light-emitting devices 10 may be bonded to the light-emitting element 1 (wafer) prior to the individual dividing process, and the wafer may be then divided into individual pieces (not shown).

In the manufacturing process of the light-emitting device in accordance with the present invention, not limited to the above-mentioned structure, the sputter device and the fixture may be formed into any structure as long as the film-forming process of the metal film and the superposing (bonding) process of the light-emitting element 1 and the wavelength conversion member 7 can be carried out, with the inert gas atmosphere or the vacuum state being maintained. For example, another structure may be used in which no load lock chamber is provided in the sputter device, with the robot arm being installed in the processing chamber, so that the light-emitting element 1 or the like may be directly transported into the processing chamber. Alternatively, still another structure may be used in which the sputter device has a plurality of stages are prepared in the processing chamber and only the light-emitting element 1 fixed onto an adhesive sheet and the wavelength conversion member 7 are transported from the load lock chamber to the respective stages of the processing chamber, and after the film-forming (sputtering) process, these may be transported onto the fixture 92 in the load lock chamber and subjected to the bonding process (not shown).

(Bonding Surface Activation Process)

In the manufacturing process of the light-emitting device in accordance with the present invention, the surface activation on the bonding surfaces of the light-emitting element 1 (substrate 2) and the wavelength conversion member 7 may be carried out not only by irradiation with ions and plasmas of the carrier gas (inert gas) at the time of the sputtering process (metal-film forming process), but also by a process prior to the sputtering. More specifically, as a cleaning process in the sputter device, by applying a predetermined discharging voltage to the FAB gun to generate Ar ions, and by further applying a predetermined accelerating voltage and a beam voltage thereto, an Ar ion beam is applied to the surfaces of the light-emitting element 1 (substrate 2) and the wavelength conversion member 7 so that, while the surfaces are being cleaned, the surfaces are simultaneously activated. Alternatively, as a method for surface activation that is not dependent on the sputter device, a heating process and an optical cleaning process or the like by the use of irradiation with ultraviolet rays and ozone are proposed. These processes for surface activation may be carried out only on either one of the light-emitting element 1 and the wavelength conversion member 7, or may be carried out on both of them, and selection may be properly carried out depending on the kinds of materials for use in forming the substrate 2 of the light emitting element 1 and the wavelength conversion member 7.

In the light-emitting device 10 in accordance with the present invention, the metal film 8 may be formed only on either one of the bonding surfaces of the light-emitting element 1 (substrate 2) and the wavelength conversion member 7 and join the film thereto by the surface activation bonding in the metal film forming process. In this case also, the same manner as in the above-mentioned process may be used as long as it continuously carries out the bonding surface activation process, the metal-film forming process and the bonding process in the inert gas atmosphere and the film-forming area is limited, for example, by allowing the sputter device to have a shutter (shielding wall) in the processing chamber. Moreover, the metal film 8 may be formed on either the light-emitting element 1 or the wavelength conversion member 7; however, the metal film 8 is preferably formed on either one of them that is made of a material, such as $SiO_2$ or the like, that is hardly bonded by the surface activation bonding. In this manner, even in the case where the metal film 8 is formed only on either one of the light-emitting element 1 and the wavelength conversion member 7, the surface activation process that is not dependent on the above-mentioned sputter device may be carried out separately, and this may be carried out on any one of the sides with the metal film 8 formed thereon and with no metal film 8 formed thereon.

The light-emitting device 10 may have a structure with no substrate 2 formed on the light-emitting element 1; that is, the wavelength conversion member 7 may be directly bonded to the semiconductor structure 3 (n-type semiconductor layer 31) with the metal film 8 interpolated therebetween (not shown). The light-emitting device of this type may be manufactured by separating the substrate 2 from the semiconductor structure 3 by using, for example, a LLO (laser lift-off) process in place of the rear surface grinding process in the above-mentioned bonding surface smoothing process. The rear surface of the exposed semiconductor structure 3 may be smoothed into a bonding surface, if necessary.

Additionally, the metal film 8 may be formed by using metal that easily transmits light emitted by the light-emitting element 1, and designed into a continuous film shape to such a degree that a required quantity of light can be extracted therefrom, and further formed to have such a film thickness as to have in-plane uniformity. In order to provide the metal film 8 of this type, the light-emitting device 10 is designed so as not to have the side faces of the light-emitting element 1 coated with the metal film 8 (metal atoms 8a), by, for example, bonding the light-emitting element 1 to the wavelength conversion member 7 prior to the individually dividing process, as described earlier. Alternatively, with respect to the light-emitting element 1, an insulating substrate, such as sapphire or the like, is used and at the time of the manufacturing process, the semiconductor structure 3 (n-type semiconductor layer 31) within the scribe area is completely removed and then the protective film 6 is coated on the entire side faces of the semiconductor structure 3 so that the electrodes of the light-emitting element 1 are prevented from causing short circuits through the metal film 8. By forming the metal film 8 having such a film thickness, the light-emitting element 1 (substrate 2) and the wavelength conversion member 7 can be easily bonded to each other, regardless of the materials for the respective materials.

An example in which wafers that schematically simulate the substrate of the light-emitting element and the optical member are bonded to each other was produced as a model of the light-emitting device of the present invention to conform effects of the present invention.

However, the present invention is not intended to be limited only by this example. The example will be described. However, the present invention is not intended to be limited only by this example.

Example 1

Preparation of Samples

Two sheets of quartz ($SiO_2$) substrates or glass substrates, each having a thickness of 0.5 mm and a diameter of 3 inches, were secured onto a fixture 92 having a structure shown in FIG. 2B, and metal films were formed thereon by a DC magnetron sputter device, and the surfaces with the metal films formed thereon were mutually superposed on each other and bonded to each other. Both of the quartz substrates and glass substrates were set to have a surface arithmetic average roughness Ra of 0.5 nm. More specifically, the two wafers secured onto the fixture were transported into a chamber of the sputter device, and the chamber was exhausted, and an Ar gas was introduced thereto to be adjusted to 0.2 Pa. Then, metal films indicated by Table 1 were formed on the two wafers respectively by sputtering. Next, with the atmosphere inside the chamber being maintained, one of the wafers was inverted to be superposed on the other wafer. The load at this time was derived from the weights of the wafer itself and the fixture.

Samples No. 1 to 4 are examples of the models of the light-emitting device in accordance with the present invention.

The thicknesses of the metal films are set to thicknesses as shown in Table 1 by adjusting the film-forming time based upon the film-forming rate of 0.10 nm/sec. Samples No. 5 and 6 are reference examples of models formed by a general atomic diffusion bonding process. In sample No. 6, Ti and Al films were successively formed from each of the wafer sides.
[Evaluation]

With respect to the samples thus prepared, the bonding state (presence or absence of unbonded areas), the bonding strength and the transmittance of light were evaluated. The bonding state was evaluated by observing the presence or absence of voids (spaces) and interference fringes occurring in unbonded areas at the interface of the two wafers. The bonding strength was evaluated based upon measurements of shear strength evaluated by the shearing force and the cleaved state of the wafers (chips) caused by dicing.
(Bonding State)

Figure 3B:
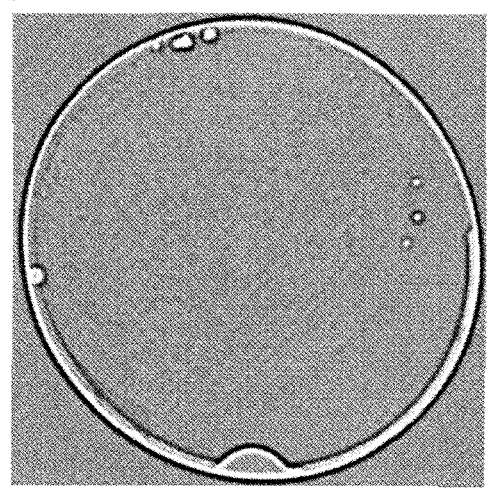
Figure 3C:
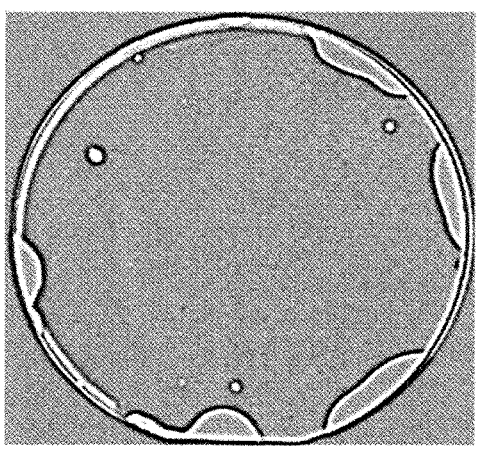
Figure 3D:
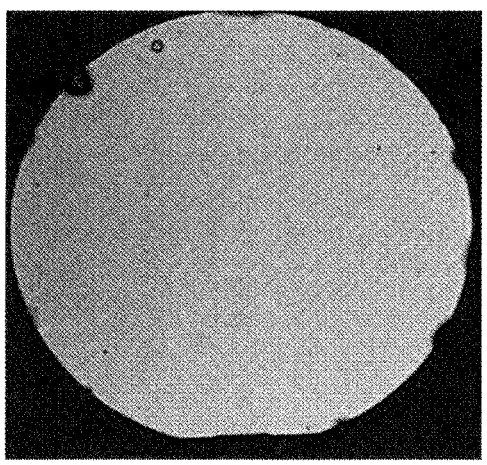
Figure 3E:
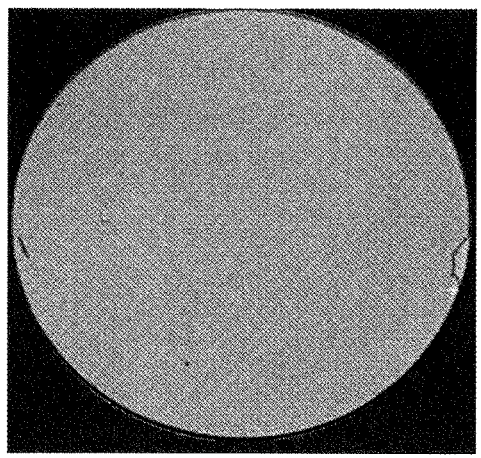

By irradiating each of samples No. 1 to 3 with visible light and light with a single spectrum (green light), the resulting widths of voids were visually observed. With respect to samples No. 5 and 6 of reference examples with thick metal films, voids were observed by an ultrasonic wave microscope. FIGS. 3A to 3C show observation images from the single color light of samples No. 1 to No. 3, and FIGS. 3D and 3E show ultrasonic wave microscopic images of samples No. 5 and No. 6.
(Dicing Test)

On each of the samples whose bonding state had been observed, half cuts having a depth reaching the bonding face of the lower side wafer (cutting the interface) were made longitudinally as well as laterally with a pitch of 1 mm by using a blade having a width of 0.1 mm. Since such a dicing process caused cleaving of the wafer (chip) at unbonded portions and portions where the bonding strength was weak, due to the cutting resistance, the appearance after the dicing process was observed.
(Measurements of Shear Strength)

With respect to samples No. 1, 2, 3, 5 and 6, portions in the area without voids in the center of the wafer were cut out with a square shape having 1 mm on each side to prepare test pieces. This test piece was horizontally mounted with the rear surface being secured, and a sensor tool was applied to its end face, and with the tip of the tool being raised by 0.1 mm from the interface between the two wafers so as to form a space, the tool was applied onto the end face of the wafer on the upper side so that a load was given in a manner so as to horizontally push the tool. The load at the time when the two wafers were separated from each other was measured as a shear strength, and Table 1 shows an average value obtained by ten test pieces.
(Light Transmittance)

Figure 4:
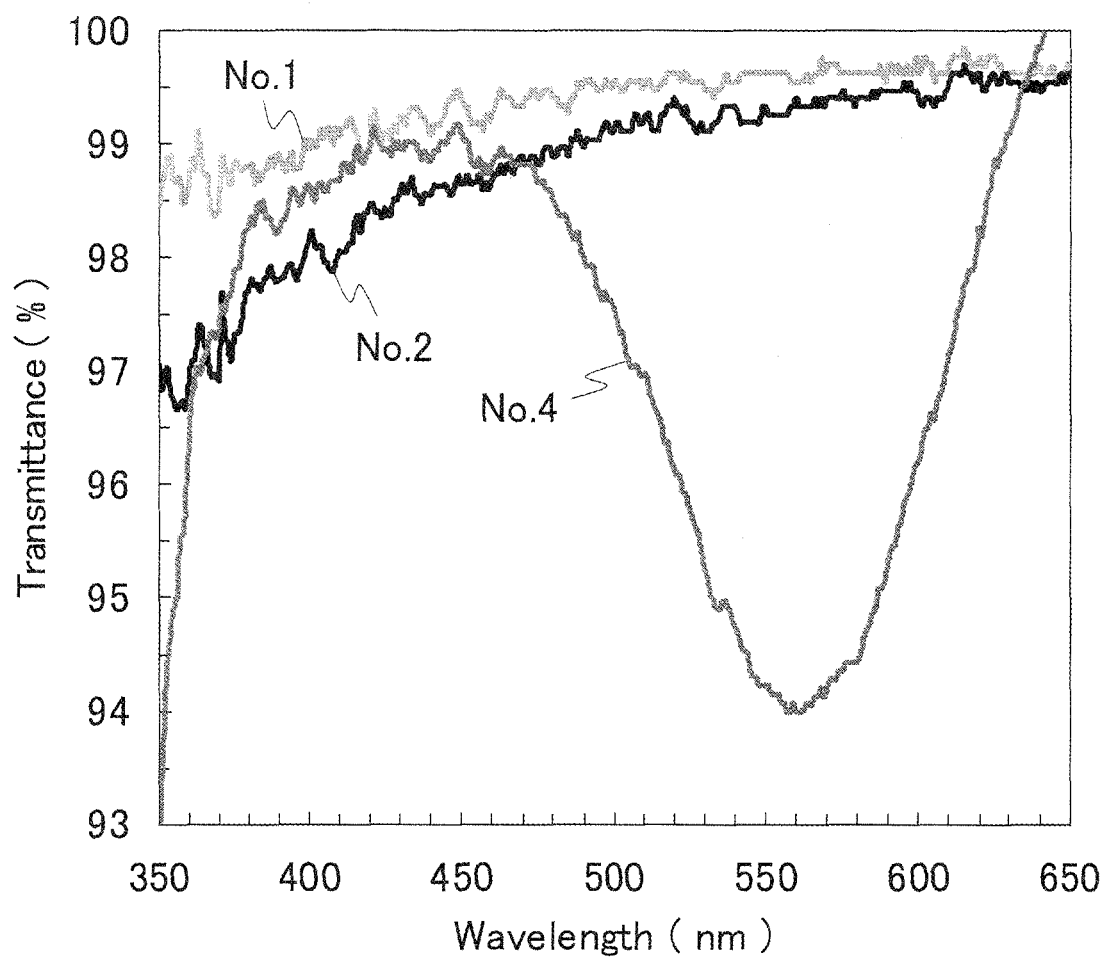
FIG. 4 is a spectral transmittance curve at an incident angle of 0° of the sample that schematically simulates a light-emitting device of the present invention for use in indicating a bonded state between the light-emitting element and the optical member.

With respect to samples No. 1, 2 and 4, light is applied thereto with an incident angle 0°, and the transmitted light was measured by using a spectrophotometer. The resulting spectral transmittance curve is shown in FIG. 4.

It was confirmed that the two wafers were bonded to each other in all the samples No. 1 to 6. Areas that look white in FIGS. 3A to 3C as well as areas that look black in FIGS. 3D and 3E are voids. In sample No. 5 of the reference sample in which Al films having sufficient thicknesses were film-formed and bonded to each other, slight voids were observed on the peripheral edge, and in sample No. 6 of the similar reference sample, hardly any voids were observed so that in any of the samples, preferable bonding states were achieved by the atomic diffusion bonding process. Moreover, as a result of a dicing process carried out on each of these samples, scattered chips (cut wafers) due to the separation on the bonding surface were observed at areas in which voids were observed, and scattered chips in the other areas were caused by a bulk destruction. However, in sample No. 5, separations at the interface were partially observed, and it was presumed that the separations were caused between the wafer and the Al film. In contrast, in the case of sample No. 6 in which the Al film was formed on the wafer surface with a Ti film interpolated therebetween, since the Al film was superior in adhesion, all the separations were caused by the bulk destruction. Therefore, sample No. 6, in particular, had high shear strength.

On the other hand, in the case of samples No. 2 and No. 3 in which an Al film having a thickness of 0.3 nm was formed on one of the sides of each wafer, although voids were observed, almost all of the voids were located on the peripheral edge, and the area thereof occupied in the wafer was narrow, with no interference fringes being observed, and the shear strength was sufficiently high in comparison with those of samples No. 5 and No. 6. Moreover, scattered chips due to a dicing process within areas without voids were observed in both of the cases due to the bulk destruction and the separation at the interface. However, it is presumed that since the shear strength was high, the scattered chips were caused not by the separation at the bonded interface (between the Al film and the Al film), but by the separation between the wafer and the Al film in the same manner as in sample No. 5. Furthermore, it can be said that there is hardly any difference in bonding process caused by kinds of materials (quartz and glass) of the wafer.

In contrast, in the case of sample No. 1 in which an Al film having a thickness of 0.2 nm was formed on one of the sides of each wafer and bonded to each other, although large voids of a certain degree were observed also on the inner side, the area thereof occupied in the wafer was small. As a result, the bonding was carried out in a sufficient area. It is presumed that, since the Al film was thin (small), those areas where irregularities on the wafer surface (bonding surface) were comparatively rough or where gaps were wide due to the adhesion of particles or the flatness of the wafer were hardly bonded to each other. However, the shear strength was sufficiently high although it was inferior to that of sample No. 2,

TABLE 1

| | | No. 1 (Example) | No. 2 (Example) | No. 3 (Example) | No. 4 (Example) | No. 5 (Reference Example) | No. 6 (Reference Example) |
|---|---|---|---|---|---|---|---|
| Sample Structure | Wafer 1 | Quartz | Quartz | Glass | Quartz | Glass | Quartz |
| | Metal Film 1 | Al (0.2) | Al (0.3) | Al (0.3) | Al (0.3) | Al (30) | Ti (1) Al (29) |
| | Metal Film 2 | Al (0.2) | Al (0.3) | Al (0.3) | Al (0.3) | Al (30) | Al (29) Ti (1) |
| | Wafer 2 | Quartz | Quartz | Glass | Quartz | Glass | Quartz |
| Shear Strength (kg) | | 4.15 | 5.46 | 5.38 | — | 4.69 | 5.83 |

Numeric values in parentheses ( ) represent film thickness (unit: nm).

and scattered chips due to a dicing process were observed in both of the cases due to the bulk destruction and the separation at the interface in the same manner as in sample No. 2. Moreover, it was confirmed that even in the case of quartz (SiO$_2$) in which it was difficult to carry out the surface activation bonding process, a firm bonding could be sufficiently realized by using a metal film having a thickness that was less than one atomic layer of this type.

In contrast to the fact that in samples No. 5 and N. 6 with metal films having a thickness of 60 nm in total formed thereon, light transmission was not visually observed (was opaque), it was confirmed that in samples No. 1 to No. 4, light transmission was visually observed. Moreover, as shown in FIG. 4, in samples No. 1 and No. 2, in which, after Al films had been formed on respective wafers, the resulting wafers were bonded to one another, it was observed that the transmittance was gradually reduced as the wavelength became shorter from the vicinity of a wavelength of 500 nm. However, in the case of sample No. 2 in which the thickness of an Al film formed on one side of each wafer was 0.3 nm, the transmittance was 98% or more in the blue light range (wavelength: 430 to 490 nm) sufficiently to be used as a light-emitting device. On the other hand, in the case of sample No. 4 in which, after Al films having a thickness of 0.3 nm had been formed on respective wafers, the resulting wafers were bonded to one another, although the transmittance was reduced in green to yellow light ranges (wavelength: 500 to 600 nm), since the transmittance was higher in the blue light range than that of sample No. 2 in which an Al film having the same thickness was formed, it can be said that the kinds of metals need to be preferably selected depending on the requirement of a light-emitting element.

Example 2

Preparation of Samples

Two sheets of sapphire substrates, each having a thickness of 0.85 mm, a diameter of 4 inches and an arithmetic average surface roughness Ra of 0.18 nm, were used and metal films as shown in Table 2 were formed thereon by a DC magnetron sputter device in the same manner as in example 1, and the surfaces with the metal films formed thereon were mutually superposed on each other and bonded to each other. Additionally, in samples No. 12 and No. 13, by providing a shutter on one sheet of wafers (sapphire substrates), an Al film was formed only on the other wafer. Moreover, in sample No. 13, prior to sputtering (prior to forming a shutter), Ar ions were generated on each of the two wafers by using a FAB gun so that the irradiation process was carried out for 10 seconds (indicated by "Ar$^+$" in Table 2).

[Evaluation]

Figure 6A:
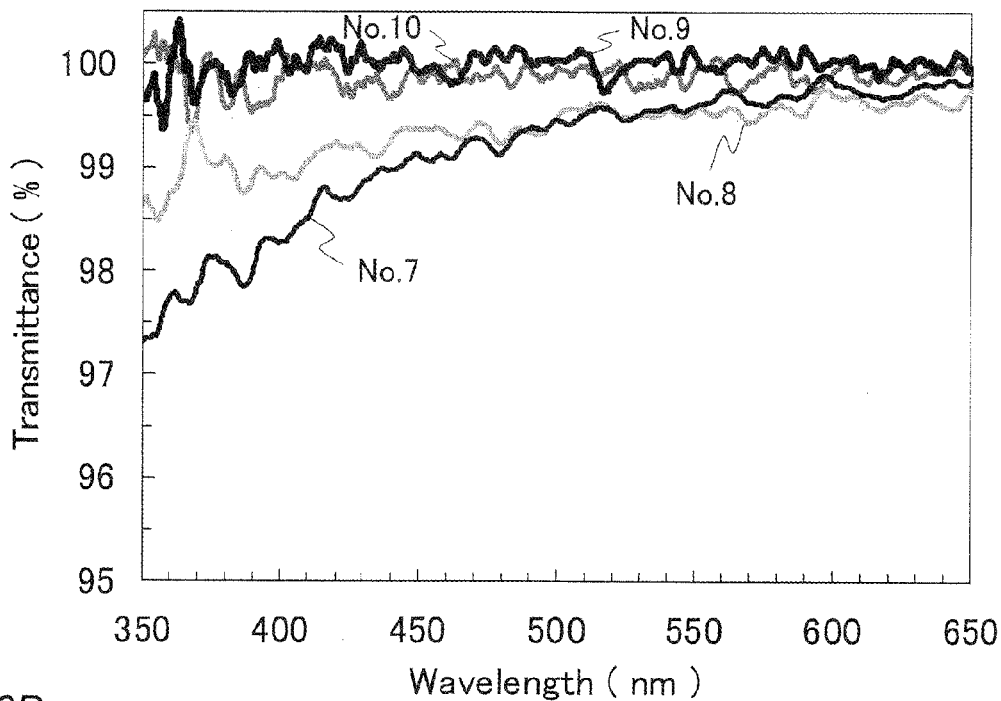
FIGS. 6A and 6B show spectral transmittance curves of a sample that schematically simulates a light-emitting device of the present invention for use in indicating a bonded state between the light-emitting element and the optical member.
Figure 6B:
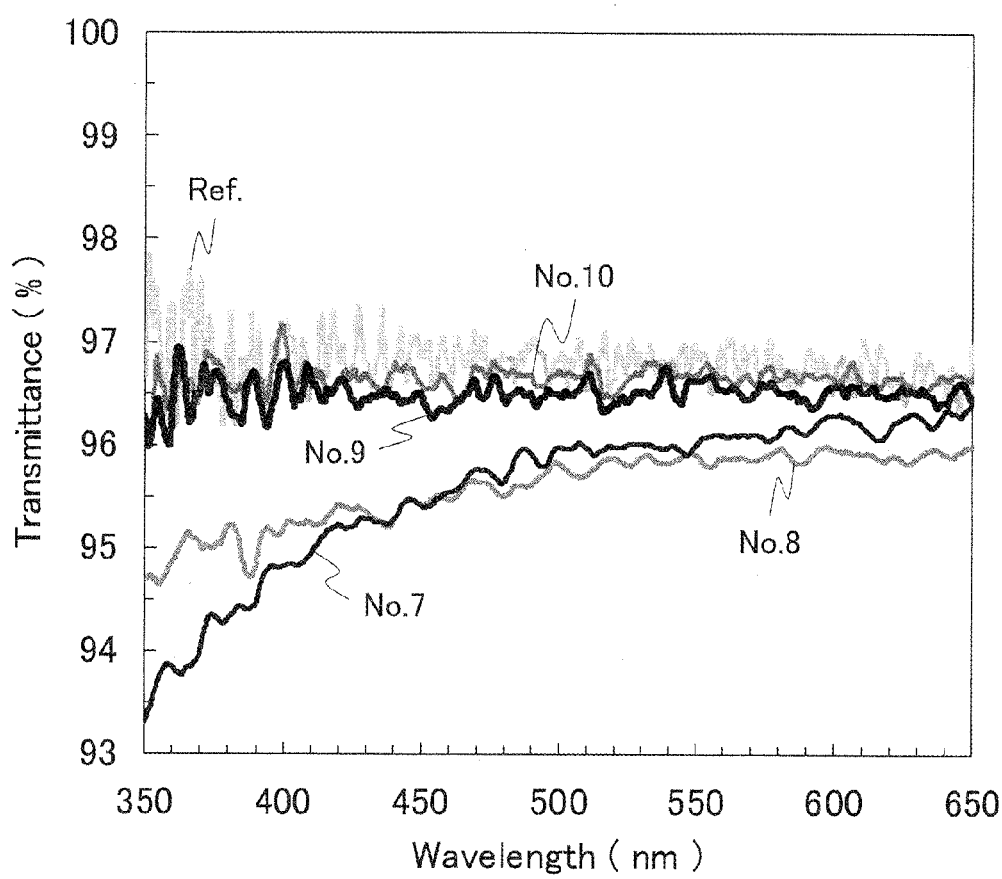

With respect to the samples thus prepared, the bonding state (presence or absence of unbonded areas) was observed by irradiating them with visible light. FIGS. 5A to 5G show appearance photographs of samples No. 7 to No. 13. Moreover, light is applied to the samples with incident angles of 0° and 50°, and the transmitted light was measured by using a spectrophotometer. FIG. 6 shows spectral transmittance curves of samples No. 7 to No. 10. Additionally, in FIG. 6B (incident angle 50°), reference data (Ref.) relating to only the sapphire substrate are shown in combination.

As shown in FIG. 5, although voids were observed in some portions of the samples, no interference fringes were found, and preferable bonding were realized in all the samples No. 7 to No. 13. In particular, when sample No. 7 (FIGS. 3B and 3C as well as FIG. 5A) and samples No. 2 and No. 3 in which the Al film of the same thickness was formed in example 1, as well as sample No. 1 and sample No. 8 (FIG. 3A and FIG. 5B), were compared with each other, samples No. 7 and No. 8 had fewer voids in spite of their larger wafer diameters. It is presumed that this is derived from the fact that the surface roughness of the wafer is small and exhibits a superior flatness.

Moreover, in sample No. 12 shown in FIG. 5F, although no Al film was formed on one of the wafers, its bonding process was carried out in the same manner as in sample No. 13 in which only the Ar ion irradiation was carried out on one of the wafers, as shown in FIG. 5G. It is presumed that this is derived from the fact that, while an Al film was being formed on the other wafer, the surface is activated by being exposed to Ar ions. Furthermore, only in sample No. 11 in which an Al film with a thickness of 0.05 nm was formed on each of two wafers shown in FIG. 5E, voids were observed at portions other than the peripheral portion. It is presumed that this is caused by in-plane deviations occurring in the film thickness of the Al film because of an extremely short (0.5 second) film-forming time.

As shown in FIG. 6, in sample No. 9 in which Al films having a thickness of 0.3 nm in total of two wafers corresponding to the atomic diameter of Al atoms were formed, as well as in sample No. 10 which had an Al film further thinner than that, no light absorption was substantially observed. Additionally, since substantially no difference was observed in the spectral transmittance curves of samples No. 11 to No. 13 from that of sample No. 10, the illustrations of those spectral transmittance curves are omitted. In contrast, in samples No. 7 and No. 8 in which Al films having a thickness exceeding the atomic diameter of Al atoms in total were formed, although a reduction in transmittance was observed in the blue light range, the transmittance was 98% or more in the blue light range at an incident angle of 0°, in the same manner as in sample No. 2 of example 1 sufficiently to be applied to a light-emitting device.

TABLE 2

|  |  | No. 7 (Example) | No. 8 (Example) | No. 9 (Example) | No. 10 (Example) | No. 11 (Example) | No. 12 (Example) | No. 13 (Example) |
|---|---|---|---|---|---|---|---|---|
| Sample Structure | Wafer 1 | Sapphire | Sapphire | Sapphire | Sapphire | Sapphire | Sapphire | Sapphire |
|  | Metal Film 1 | Al (0.3) | Al (0.2) | Al (0.15) | Al (0.1) | Al (0.05) | Al (0.1) | Al (0.1) |
|  | Metal Film 2 | Al (0.3) | Al (0.2) | Al (0.15) | Al (0.1) | Al (0.05) | — (0) | Ar$^+$ (0) |
|  | Wafer 2 | Sapphire | Sapphire | Sapphire | Sapphire | Sapphire | Sapphire | Sapphire |

Numeric values in parentheses ( ) represent film thickness (unit: nm).

Although various modes for carrying out the present invention have been explained with respect to the light-emitting device of the present invention and the manufacturing method thereof, the present invention is not intended to be limited by the above-mentioned embodiments, and it is needless to say that those various modifications and revisions made therein based upon these descriptions are included within the gist of the present invention.

What is claimed is:

1. A light-emitting device comprising:
    a light-emitting element having a semiconductor layer and an optical member,
    wherein the optical member is bonded to the light-emitting surface of the light-emitting element with a metal film being interposed therebetween, and
    wherein the metal film has one or more regions having a thickness not more than 2 times of an atomic diameter of metal atoms forming the metal film.

2. The light-emitting device according to claim 1, wherein the one or more regions have a thickness less than 2 times of the atomic diameter of the metal atoms forming the metal film.

3. The light-emitting device according to claim 1, wherein the one or more regions have a thickness not more than the atomic diameter of the metal atoms forming the metal film.

4. The light-emitting device according to claim 1, wherein the metal film has metal portions separated from each other.

5. The light-emitting device according to claim 1, wherein the semiconductor layer or a substrate provided with the semiconductor layer of the light-emitting element is bonded to the optical member with the metal film or the metal portions.

6. The light-emitting device according to claim 1, wherein the metal film or the metal portions are made of one selected from a group of Al, Ti and Au.

7. The light-emitting device according to claim 1, wherein the light-emitting element is partially bonded to the optical member with a surface activation bonding.

8. The light-emitting device according to claim 1, wherein the metal film comprises Al.

9. The light-emitting device according to claim 1, wherein the metal film comprises Au, and wherein the optical member converts the light from the light-emitting element to a light having a peak wavelength in a range of 500 to 600 nm.

10. The light-emitting device according to claim 1, further comprising a reflection layer on opposite side of the light emitting surface of the light-emitting element.

11. A manufacturing method of a light-emitting device on which an optical member is bonded to a light-emitting surface of a light-emitting element having a semiconductor layer, the method comprising:
    a metal film forming process for forming a metal film on at least one of bonding surfaces of the optical member and the light-emitting element so as to have one or more regions having a thickness not more than an atomic diameter of the metal atoms forming the metal film, and
    a bonding process for bonding the mutual bonding surfaces with each other by making the bonding surfaces in contact with each other,
    wherein the metal film forming process and the bonding process are continuously carried out in an inert gas atmosphere.

12. The manufacturing method according to claim 11, further comprising a bonding surface smoothing process for smoothing the bonding surface of the light-emitting element and the bonding surface of the optical member so as to have an arithmetic average roughness Ra of 1 nm or less.

13. The manufacturing method according to claim 11, wherein in the metal film forming process the metal film is formed such that the one or more regions have a thickness of less than the atomic diameter of the metal atoms forming the metal film.

14. The manufacturing method according to claim 11, wherein in the metal film forming process the metal film is formed such that the one or more regions have a thickness not more than half of the atomic diameter of the metal atoms forming the metal film.

15. The manufacturing method according to claim 11, further comprising a bonding surface activation process for activating the bonding surface of the light-emitting element and/or the bonding surface of the optical member.

* * * * *